United States Patent [19]
Inoue et al.

[11] Patent Number: 5,514,903
[45] Date of Patent: May 7, 1996

[54] COMPOUND SEMICONDUCTOR SINGLE-CRYSTALLINE SUBSTRATE FOR LIQUID PHASE EPITAXIAL GROWTH

[75] Inventors: Tetsuya Inoue; Makoto Otsuki; Tetsuichi Yokota, all of Hyogo, Japan

[73] Assignee: Sumitomo Electric Industries, Ltd., Osaka, Japan

[21] Appl. No.: 400,271

[22] Filed: Mar. 3, 1995

Related U.S. Application Data

[63] Continuation of Ser. No. 204,059, Mar. 1, 1994, abandoned.

[30]    Foreign Application Priority Data

Mar. 2, 1993   [JP]   Japan ........................... 5-40336

[51] Int. Cl.$^6$ ................................... H01L 29/06
[52] U.S. Cl. .................... 257/618; 257/95; 257/622
[58] Field of Search .................... 257/95, 94, 98, 257/618, 622

[56]    References Cited

U.S. PATENT DOCUMENTS

| | | | |
|---|---|---|---|
| 3,877,052 | 4/1975 | Dixon et al. | 257/95 |
| 5,040,044 | 8/1991 | Noguchi et al. | 257/95 |
| 5,260,588 | 11/1993 | Ohta et al. | 257/93 |

FOREIGN PATENT DOCUMENTS 63-256600  10/1988  Japan ........................... 257/95

*Primary Examiner*—Donald L. Monin, Jr.
*Attorney, Agent, or Firm*—W. G. Fasse; W. F. Fasse

[57]    ABSTRACT

The disclosed compound semiconductor single-crystalline substrate for liquid phase epitaxial growth has a relatively low cost and excellent practicality. This compound semiconductor single-crystalline substrate has a surface roughness of at least 1 μm and not more than 10 μm as measured over a line of 1 mm length. This substrate is employed as a substrate for an epitaxial wafer for an infrared- or visible light-emitting diode. Due to its particular roughness, the substrate can be prevented from slipping or falling while it is transported during processing. Furthermore, no lapping and polishing are required for manufacturing the substrate. Thus, the substrate for liquid phase epitaxial growth can be provided at a relatively low cost.

19 Claims, 2 Drawing Sheets

COMPOUND SEMICONDUCTOR SINGLE-CRYSTALLINE SUBSTRATE FOR LIQUID PHASE EPITAXIAL GROWTH

This application is a File Wrapper Continuation of application Ser. No. 08/204,059 filed on Mar. 1, 1994 now abandoned.

FIELD OF THE INVENTION

The present invention relates to a compound semiconductor single-crystalline substrate which is employed for liquid phase epitaxial growth.

BACKGROUND INFORMATION

In general according to the prior art, the surface of a compound semiconductor substrate for epitaxial growth is polished into a mirror finished surface. The roughness of this surface is generally less than 1 µm as measured over each 1 mm line. Such a substrate having a mirror finished surface or a nearly mirror finished surface is obtained by slicing a single-crystalline ingot, thereafter rounding the as-obtained substrate as needed, lapping its surface, and polishing the same as needed. It has been common knowledge for those skilled in the art to finish the surface of such a substrate into a mirror finished surface or nearly mirror finished surface, in order to maintain important characteristics, such as flatness, uniformity in thickness and stability of electro-optical properties, of an epitaxial layer that is to be grown on the surface of the substrate.

While epitaxial growth is carried out by various methods such as vapor deposition, liquid phase epitaxy and molecular beam epitaxy, a substrate having a mirror finished surface or a surface which is nearly mirror finished is generally employed in every method. In fact, it can be said that there has been no idea of using a substrate having a rough surface to make a liquid phase epitaxial wafer for a light emitting diode.

Manufacturing such a conventional substrate having a mirror finished surface or a surface which is nearly mirror finished, however, requires much time and trouble as well as a high cost due to the required slicing, lapping and polishing steps. Further, a GaAs substrate about 76 mm in diameter and 600 µm in thickness weighs about 14 g, and easily slips from holding tools and falls down during transportation if the substrate has a mirror finished surface.

SUMMARY OF THE INVENTION

In order to solve the aforementioned problems, an object of the present invention is to provide a very practically compound semiconductor single-crystalline substrate for liquid phase epitaxial growth, which has a relatively low cost and a reduced tendency to slip during transportation.

In the inventive compound semiconductor single-crystalline substrate for liquid phase epitaxial growth, the average value of surface roughness levels that are measured in a plurality of portions or areas on the substrate surface is within a range of at least 1 µm and not more than 20 µm, and preferably not more than 10µm.

Further according to the invention, at least 50 % of a plurality of surface roughness values measured on the substrate surface one by one in every region of about 1 $cm^2$ in surface area are within a range of at least 1 µm and not more than 20 µm, preferably at least 1 µm and not more than 10 µm. The term "surface roughness" means the difference between the maximum height and the minimum height that are measured on the surface in a region of about 1 $cm^2$ in surface area along a line 1 mm in length. The surface roughness is measured with a stylus having a radius of curvature of 1 to 50 µm in its forward end, which is in contact with the surface of the substrate.

Preferably, the substrate is prepared from a GaAs compound semiconductor. This substrate is employed as a substrate for an epitaxial wafer for an infrared- or visible light-emitting diode. Because the substrate has a particular surface roughness according to the invention, no lapping and polishing are required in manufacturing the substrate. Thus, it is possible to reduce the time and trouble required for manufacturing, so as to obtain the substrate at a relatively low cost. Further, the problem of the substrate slopping during transportation is also reduced, because the substrate has a rougher surface as compared with that having a mirror finished surface. The inventive semiconductor single-crystalline substrate is by advantageously used for an epitaxial wafer for an infrared- or visible light-emitting diode, particularly in a GaAs single-crystalline substrate.

An epitaxial layer used for such a light emitting diode generally has a thickness of at least 10 µm. The inventors have found that the substrate crystal does not have to have a mirror finished surface or an early mirror finished surface for growing an epitaxial layer having such a thickness by liquid phase epitaxy. It is possible to effectively use the inventive substrate having the claimed surface roughness by setting proper conditions in liquid phase epitaxy. An epitaxial layer for an electronic device or the like that is grown by vapor deposition or molecular beam epitaxy has a thickness of less than 10 µm in general, whereby these types of epitaxy have a tendency to cause the irregularity of the substrate surface to be reflected onto the surface of the epitaxially grown layer in fidelity. Therefore, it is impossible to use a substrate having a rough surface for vapor deposition or molecular beam epitaxy.

When the surface roughness of the substrate is less than 1 µm, the substrate easily slips from holding tools and falls down during transportation. When the surface roughness of the substrate exceeds 20 µm, on the other hand, the occurrence of abnormality on the epitaxial layer grown on the surface of the substrate is abruptly increased.

When each individual measured surface area is less than 1 $cm^2$, it takes much time to measure the surface roughness over the entire substrate, whereby a high cost results due to the low productivity. When the measured surface area exceeds 1 $cm^2$, on the other hand, the measurements become less precise. It is preferable to measure a small total surface area so that the productivity may not deteriorate for evaluating the characteristics of the surface of substrate.

The foregoing and other objects, features, aspects and advantages of the present invention will become more apparent from the following detailed description of the present invention when taken in conjunction with the accompanying drawings.

BRIEF DESCRIPTION OF THE DRAWINGS

In order that the invention may be clearly understood, it will now be described, by way of example, with reference to the accompanying drawings, wherein.

DESCRIPTION OF PREFERRED EXAMPLE EMBODIMENTS AND OF THE BEST MODE OF THE INVENTION

EXAMPLE 1

Figure 1:
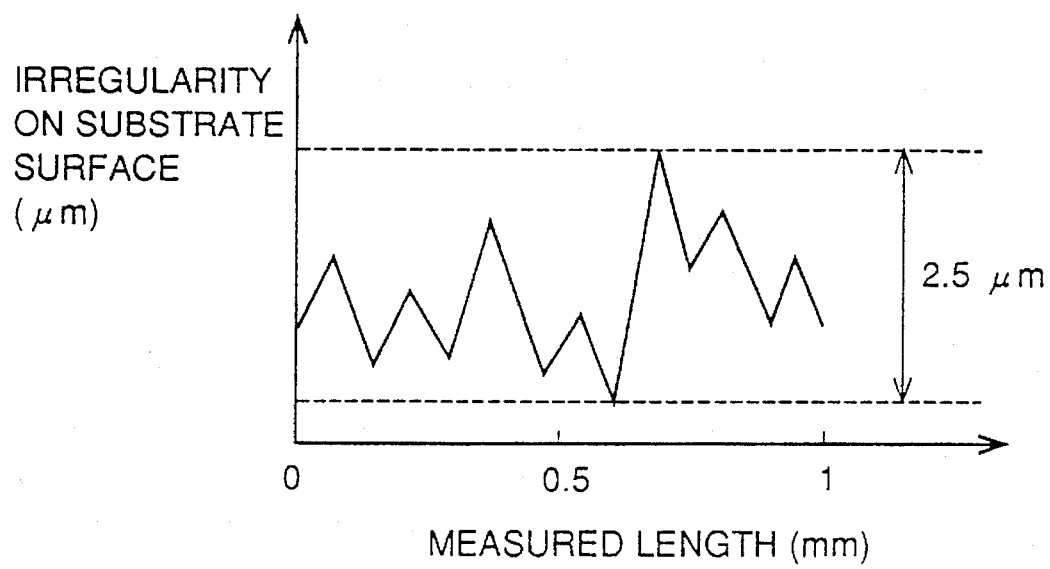
FIG. 1 is a graph showing a exemplary surface roughness of a compound semiconductor single-crystalline substrate according to the present invention.

A GaAs single-crystalline ingot, which was grown by a boat method, was sliced into wafers 530 μm in thickness. Each wafer was worked into a circle 76 mm in diameter, to obtain a substrate for liquid phase epitaxial growth. The slicer was prepared from an ordinary inner peripheral cutting edge grindstone on which diamond abrasive grains were electrodeposited. Respective parts of this slicer were improved in mechanical accuracy, while grain sizes and shapes of the diamond abrasive grains were optimized to improve surface roughness. After the slicing, the surface roughness of the wafer was measured one by one for each area of about 1 cm², on a line 1 mm in length. The as-measured surface roughness levels were 1 to 4 μm in at least 50% of the measuring areas or points. FIG. 1 shows an exemplary result of the as-measured surface roughness i.e. of 2.5 μm measured as the difference between the maximum height and the minimum height along a 1 mm long line in one area measuring 1 cm².

Figure 4:
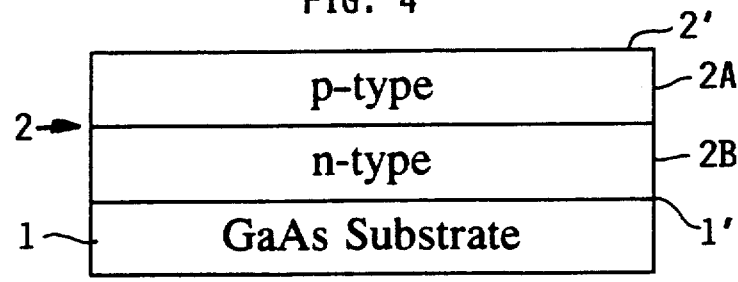
FIG. 4 is a schematic view of an infrared emitting diode prepared according to Example 1 of the invention.

As shown in FIG. 4, an Si-doped GaAs epitaxial layer 2 for an infrared-emitting diode was formed on this GaAs single-crystalline substrate 1 by liquid phase epitaxy. The as-formed epitaxial layer 2 had a total thickness of 180 μm including those of p-type and n-type layers 2A and 2B, respectively, and uniformity of the thickness was within ±5% in the wafer plane and between such wafers. The surface 2' of the epitaxial layer 2 was in an excellent state with no abnormal growth etc. It is preferable to melt back the substrate surface 1', i.e., to partially dissolve the substrate surface 1' in a raw material solution before starting the epitaxial growth. It was found that it is possible to obtain an epitaxial layer having a flat surface with a uniform thickness by optimizing melt-back conditions. A light emitting diode which was prepared from this epitaxial wafer had excellent electrical and optical properties.

EXAMPLE 2

A GaAs single-crystalline ingot, which was grown by a boat method, was sliced into wafers 370 μm in thickness. Each wafer was worked into a circle 50 mm in diameter, to obtain a substrate for liquid phase epitaxial growth. The slicer was prepared from an ordinary inner peripheral cutting edge grindstone on which diamond abrasive grains were electrodeposited. Respective parts of this slicer were improved in mechanical accuracy, while grain sizes and shapes of the diamond abrasive grains were optimized to improve surface roughness. After the slicing, the surface roughness of the wafer was measured, one by one for each area about 1 cm², on a line 1 mm in length. The as-measured surface roughness levels were 5 to 13 μm in at least 50% of the measuring areas of points.

Figure 5:
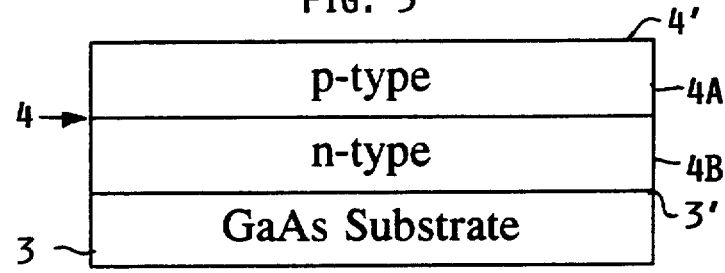
FIG. 5 is a schematic view of an infrared emitting diode prepared according to Example 2 of the invention.

As shown in FIG. 5, an Si-doped GaAs epitaxial layer 4 for an infrared-emitting diode was formed on this GaAs single-crystalline substrate 3 by liquid phase epitaxy. The as-formed epitaxial layer 4 had a total thickness of 180 μm including those of p-type and n-type layers 4A and 4B, respectively, and uniformity of the thickness was within ±5% in the wafer plane and between such wafers. The surface 4' of the epitaxial layer 4 was in an excellent state with no abnormal growth etc. It is preferable to melt back the substrate surface 3', i.e., to partially dissolve the substrate surface 3' in a raw material solution before starting the epitaxial growth. It was found that it is possible to obtain an epitaxial layer having a flat surface with a uniform thickness by optimizing melt-back conditions. A light emitting diode which was prepared from this epitaxial wafer had excellent electrical and optical properties.

EXAMPLE 3

Figure 6:
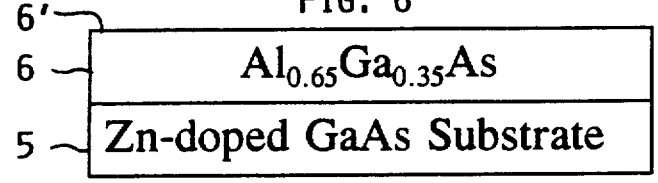
FIG. 6 is a schematic view of a Zn-doped GaAs substrate with an $Al_{0.65}Ga_{0.35}As$ epitaxial layer formed thereon by liquid phase epitaxy according to Example 3 of the invention.

A Zn-doped GaAs single-crystalline ingot, which was grown by a boat method, was sliced into wafers 600 μm in thickness. Each wafer was worked into a circle 76 mm in diameter, to obtain a substrate for liquid phase epitaxial growth. Surface roughness of the wafer was measured, one by one for each area of about 1 cm², on a line 1 mm in length. The as-measured surface roughness levels were 5 to 7 μm in at least 50% of the measuring areas or points. As shown in FIG. 6, an $Al_{0.65}Ga_{0.35}As$ epitaxial layer 6 of 10 μm thickness was formed on this substrate 5 by liquid phase epitaxy. Uniformity of the thickness of the as-formed epitaxial layer 6 was within ±3% in the wafer plane and between such wafers. The surface 6' of the epitaxial layer 6 was in an excellent state with no abnormal growth etc.

EXAMPLE 4

Figure 7:
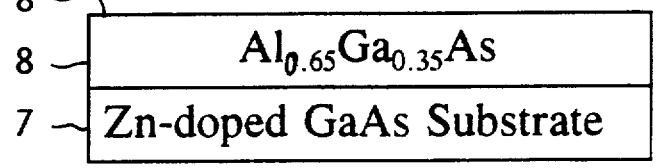
FIG. 7 is a schematic view of a Zn-doped GaAs substrate with an $Al_{0.65}Ga_{0.35}As$ epitaxial layer formed thereon by liquid phase epitaxy according to Example 4 of the invention.

A Zn-doped GaAs single-crystalline ingot, which was grown by a boat method, was sliced into wafers 370 μm in thickness. Each wafer was worked into a circle 50 mm in diameter, to obtain a substrate for liquid phase epitaxial growth. Surface roughness of the wafer was measured, one by one for each area of about 1 cm², on a line 1 mm in length. The as-measured surface roughness levels were 9 to 16 μm in at least 50% of the measuring areas or points. As shown in FIG. 7, an $Al_{0.65}Ga_{0.35}As$ epitaxial layer 8 of 10 μm thickness was formed on this substrate 7 by liquid phase epitaxy. Uniformity of the thickness of the as-formed epitaxial layer 8 was within ±3% in the wafer plane and between such wafers. The surface 8' of the epitaxial layer 8 was in an excellent state with no abnormal growth etc.

In the aforementioned four Examples, it was recognized that the substrates for epitaxially growing AlGaAs may have somewhat rough surfaces as compared with those for growing GaAs, conceivably because of the property that a growth surface of AlGaAs is easy to flatten as compared with GaAs.

COMPARATIVE EXPERIMENTAL EXAMPLE 1

Figure 2:
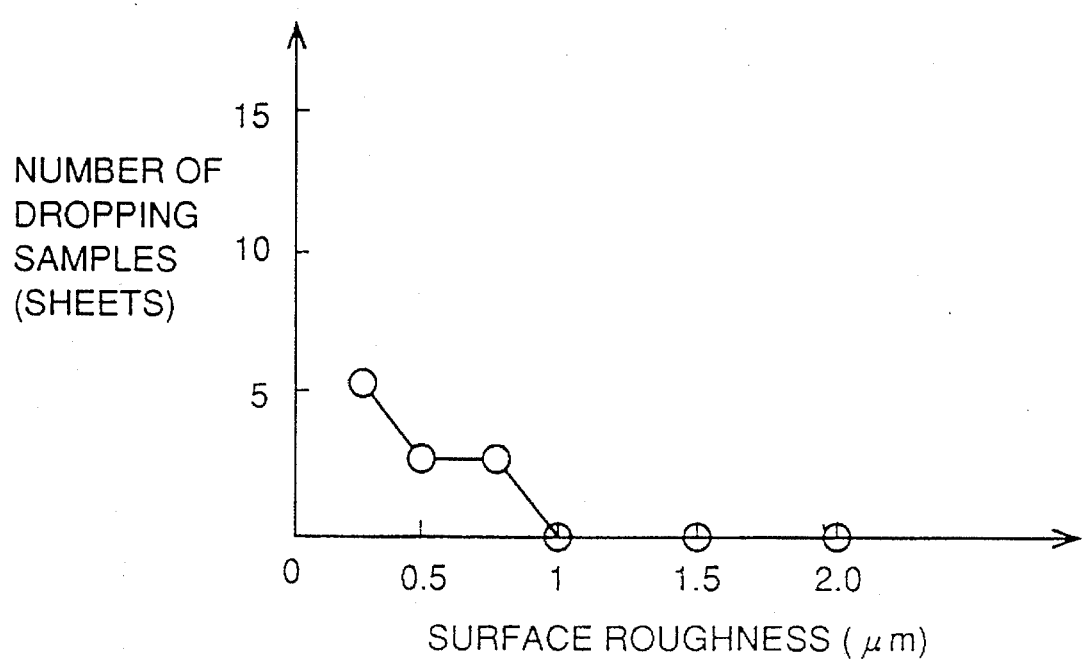
FIG. 2 is a graph showing the results of an experiment to determine numbers of dropping samples relative to the surface roughness of the substrate samples.

Various types of wafers having a surface roughness of not more than 2 μm were subjected to examination of numbers of those wafers dropping from a holding tove during transportation. For to each of six types of wafers having surface roughness levels of 0.2 μm to 2 μm, 1000 samples were held with a pincette having forward ends of resin and were than transported while being held. FIG. 2 shows the results. As shown in FIG. 2, 3 to 6 samples dropped in each group of wafers of less than 1 μm surface roughness, while no sample dropped in each group of wafers of at least 1 μm surface roughness.

COMPARATIVE EXPERIMENTAL EXAMPLE 2

Figure 3:
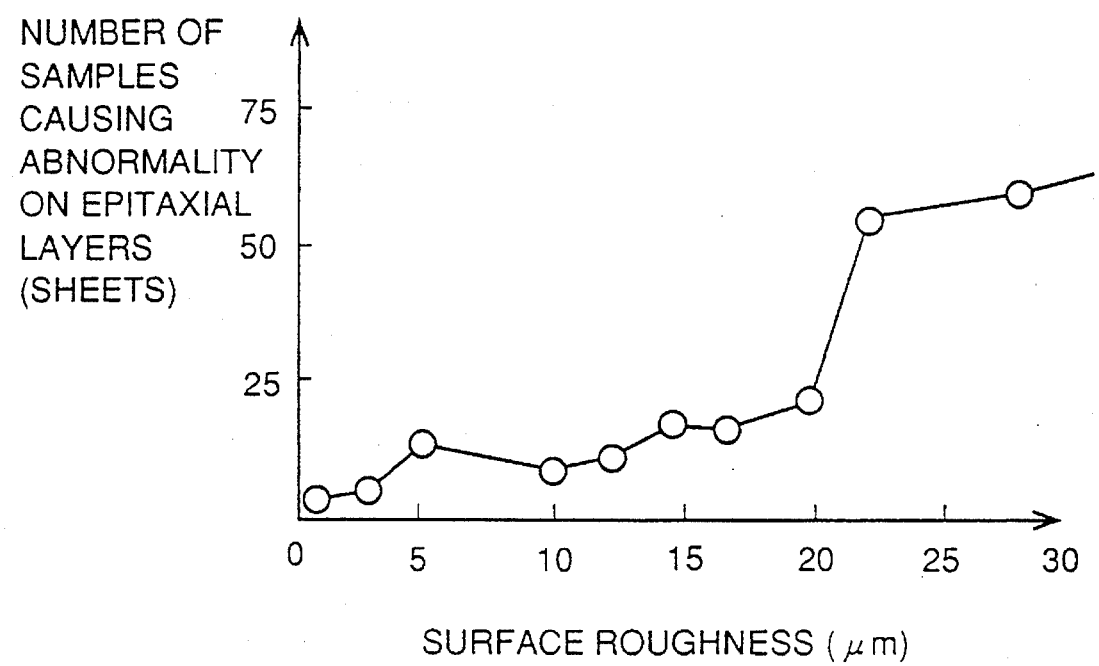
FIG. 3 is a graph showing a relation between the surface roughness levels of substrates and the numbers of samples causing an abnormality on surfaces of epitaxial layers formed on the substrates.

Various types of wafers having a surface roughness of μm to 30 μm were employed as substrates for growing GaAs epitaxial layers about 20 μm in thickness. 100 samples were prepared for each of 10 types of wafers having surface roughness levels of 1 μm to 30 μm, to examine the relation between the surface roughness levels of the substrates and the rate or degree of occurrence of surface abnormality in the as-grown epitaxial layers. FIG. 3 shows the results. As shown in FIG. 3, the wafers of not more than 20 μm surface roughness exhibited an infrequent occurrence of abnormalities on the surfaces of the epitaxial layers, while the occurrence of such abnormalities was abruptly increased when the surface roughness exceeded 20 μm. The occurrence of abnormalities was particularly small in a range of surface roughness of at least 1 μm and not more than 10 μm.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor element comprising a compound semiconductor single-crystalline substrate for liquid phase epitaxial growth thereon, wherein said substrate has rough surface means for reducing slipping of said substrate from a holding tool, said means have an average surface roughness within a range from 1 μm to 20 μm inclusive, said average surface roughness is an average of a plurality of roughness values measured respectively at a plurality of measurement areas each having an area of about 1 cm$^2$ on said surface, each roughness value is a difference between a maximum surface height and a minimum surface height along a 1 mm long line within a respective one of said measurement areas, and at least 50% of said roughness values are within a range from 1 μm to 20 μm inclusive.

2. The semiconductor element of claim 1, wherein at least 50% of said roughness values are within a range from 1 μm to 10 μm inclusive.

3. The semiconductor element of claim 1, wherein said average surface roughness is within a range from 1 μm to 10 μm inclusive.

4. The semiconductor element of claim 1, wherein said substrate consists of a GaAs compound semiconductor.

5. The semiconductor element of claim 1, wherein said substrate is from about 370 μm to about 600 μm thick.

6. The semiconductor element of claim 1, wherein said average surface roughness is within the range from 5 μm to 20 μm.

7. A semiconductor element comprising a compound semiconductor single-crystalline substrate for liquid phase epitaxial growth thereon, wherein said substrate has rough surface means for reducing slipping of said substrate from a holding tool, and said means have an average surface roughness within a range from 1 μm to 20 μm inclusive, further comprising an epitaxial layer grown on said rough surface means of said substrate by liquid phase epitaxy, wherein said rough surface means forms a rough internal feature between said single-crystalline substrate and said epitaxial layer, and said epitaxial layer is at least about 10 μm thick and has a thickness that varies less than about ±5%.

8. The semiconductor element of claim 7, wherein said single-crystalline substrate comprises an intrinsic semiconductor material wafer, and said epitaxial layer comprises a doped semiconductor material layer.

9. The semiconductor element of claim 7, wherein said epitaxial layer has external surfaces that are substantially smooth compared to said average surface roughness.

10. The semiconductor element of claim 7, wherein said epitaxial layer comprises an n-type semiconductor layer and a p-type semiconductor layer.

11. The semiconductor element of claim 7, wherein said epitaxial layer is up to about 180 μm thick.

12. The semiconductor of element of claim 7, wherein said thickness varies less than about ±3%.

13. The semiconductor element of claim 7, being a light-emitting diode of one of the infrared type and the visible light type.

14. A semiconductor element comprising a compound semiconductor single-crystalline substrate for liquid phase epitaxial growth thereon, wherein said substrate has rough surface means for reducing slipping of said substrate from a holding tool, and said means have an average surface roughness within a range from 1 μm to 20 μm inclusive, further comprising an epitaxial layer grown on said rough surface means of said substrate by liquid phase epitaxy, wherein said rough surface means forms a rough internal feature between said single-crystalline substrate and said epitaxial layer, said single-crystalline substrate comprises an intrinsic GaAs wafer, and said epitaxial layer comprises a doped GaAs layer.

15. A semiconductor element comprising a compound semiconductor single-crystalline substrate for liquid phase epitaxial growth thereon, wherein said substrate has rough surface means for reducing slipping of said substrate from a holding tool, and said means have an average surface roughness within a range from 1 μm to 20 μm inclusive, further comprising an epitaxial layer grown on said rough surface means of said substrate by liquid phase epitaxy, wherein said rough surface means forms a rough internal feature between said single-crystalline substrate and said epitaxial layer, said single-crystalline substrate comprises a Zn-doped GaAs wafer, and said epitaxial layer comprises an AlGaAs layer.

16. A semiconductor element comprising a compound semiconductor single-crystalline substrate for liquid phase epitaxial growth thereon, wherein said substrate has at least one rough surface having an average surface roughness within a range from 1 μm to 20 μm inclusive, further comprising an epitaxial layer grown on said rough surface of said substrate by liquid phase epitaxy, wherein said rough surface forms a rough internal feature between said single-crystalline substrate and said epitaxial layer, said single-crystalline substrate comprises a Zn-doped GaAs wafer, and said epitaxial layer comprises an AlGaAs layer.

17. The semiconductor element of claim 16, wherein said average surface roughness is within the range from 5 μm to 20 μm.

18. The semiconductor element of claim 16, wherein said single-crystalline substrate comprises an intrinsic semiconductor material wafer, and said epitaxial layer comprises a doped semiconductor material layer.

19. The semiconductor element of claim 16, wherein said epitaxial layer has external surfaces that are substantially smooth compared to said average surface roughness.

* * * * *

UNITED STATES PATENT AND TRADEMARK OFFICE
CERTIFICATE OF CORRECTION

PATENT NO. : 5,514,903
DATED : May 7, 1996
INVENTOR(S) : Inoue et al.

It is certified that error appears in the above-indentified patent and that said Letters Patent is hereby corrected as shown below:

Column 1, line 51, replace "practically" by --practical--.
Column 2, line 10, insert a paragraph spacing between "diode." and "Because";
          line 15, replace "slopping" by --slipping--;
          line 19, delete "by".
Column 4, line 58, replace "rough" by --rougher--;
          line 65, replace "tove" by --tool--;
          line 66, delete "to".
Column 5, line 1, replace "than" by --then--;
          line 9, replace "/um" by --1/um--;
          line 19, delete "was".

Signed and Sealed this

Thirteenth Day of August, 1996

Attest:

BRUCE LEHMAN

*Attesting Officer*           *Commissioner of Patents and Trademarks*

UNITED STATES PATENT AND TRADEMARK OFFICE
CERTIFICATE OF CORRECTION

PATENT NO. : 5,514,903

DATED : May 7, 1996

INVENTOR(S) : Inoue et al

It is certified that error appears in the above-indentified patent and that said Letters Patent is hereby corrected as shown below:

On the title page:

Drawings

Add the drawing sheet, consisting of Figs. 4, 5, 6, and 7, as shown on the attached sheet.

Signed and Sealed this

Seventeenth Day of December, 1996

Attest:

BRUCE LEHMAN

*Attesting Officer*   *Commissioner of Patents and Trademarks*